(12) United States Patent
Kim

(10) Patent No.: US 8,188,531 B2
(45) Date of Patent: May 29, 2012

(54) DUAL GATE OF SEMICONDUCTOR DEVICE CAPABLE OF FORMING A LAYER DOPED IN HIGH CONCENTRATION OVER A RECESSED PORTION OF SUBSTRATE FOR FORMING DUAL GATE WITH RECESS CHANNEL STRUCTURE AND METHOD FOR MANUFACTURING THE SAME

(75) Inventor: Young Hoon Kim, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 30 days.

(21) Appl. No.: 12/843,184

(22) Filed: Jul. 26, 2010

(65) Prior Publication Data

US 2010/0289077 A1 Nov. 18, 2010

Related U.S. Application Data

(62) Division of application No. 11/968,461, filed on Jan. 2, 2008, now Pat. No. 7,790,588.

(30) Foreign Application Priority Data

Nov. 14, 2007 (KR) ........................ 10-2007-0116054

(51) Int. Cl.
*H01L 29/76* (2006.01)
(52) U.S. Cl. .................. 257/314; 257/328; 257/E21.384
(58) Field of Classification Search .................. 257/288, 257/314–326, 327, 328, 355–363, E21.042, 257/E21.884
See application file for complete search history.

(56) References Cited

U.S. PATENT DOCUMENTS

| 7,629,219 B2 | 12/2009 | Lim et al. | |
| 2007/0148876 A1* | 6/2007 | Yu | 438/275 |
| 2009/0065853 A1* | 3/2009 | Hanafi | 257/327 |

FOREIGN PATENT DOCUMENTS

| JP | 2003-332458 A | 11/2003 |
| KR | 1020020046322 A | 6/2002 |
| KR | 1020030084144 A | 11/2003 |
| KR | 1020070108018 A | 11/2007 |

OTHER PUBLICATIONS

USPTO NOA mailed Jun. 2, 2010 for U.S. Appl. No. 11/968,461.

* cited by examiner

*Primary Examiner* — Thomas L Dickey
*Assistant Examiner* — Scott R Wilson
(74) *Attorney, Agent, or Firm* — Ladas & Parry LLP

(57) ABSTRACT

A dual gate of a semiconductor device includes a semiconductor substrate divided into a cell region with a recessed gate forming area and a peripheral region with PMOS and NMOS forming areas; first and second conductive type SiGe layers, the first conductive type SiGe layer being formed over the cell region and the PMOS forming area of the peripheral region, and the second conductive type SiGe layer being formed over the NMOS forming area of the peripheral region; first and second conductive type polysilicon layers, the first conductive type polysilicon layer being formed over the first conductive type SiGe layer and the second conductive type polysilicon layer being formed over the second conductive type SiGe layer; and a metallic layer and a hard mask layer stacked over the first and second conductive type polysilicon layers.

10 Claims, 6 Drawing Sheets

DUAL GATE OF SEMICONDUCTOR DEVICE CAPABLE OF FORMING A LAYER DOPED IN HIGH CONCENTRATION OVER A RECESSED PORTION OF SUBSTRATE FOR FORMING DUAL GATE WITH RECESS CHANNEL STRUCTURE AND METHOD FOR MANUFACTURING THE SAME

CROSS-REFERENCE TO RELATED APPLICATIONS

The present application claims priority to Korean patent application number 10-2007-0116054 filed on Nov. 14, 2007, which is incorporated herein by reference in its entirety.

BACKGROUND OF THE INVENTION

The present invention relates to a dual gate of a semiconductor device and a method for manufacturing the same, and more particularly to a dual gate of a semiconductor device capable of forming a layer doped in a high concentration over a recessed portion of a semiconductor substrate when forming a dual gate having a recess channel structure and a method for manufacturing the same.

As is known in the art, a conductive layer of a gate of a MOSFET device is mainly made of a polysilicon layer. This is because the polysilicon layer displays the physical properties required for a gate such as a high melting point, ease of forming a thin film, ease of patterning a line, and stability in an oxidation atmosphere and formation of a planarized surface. In an actual MOSFET device, a polysilicon gate contains a dopant such as phosphorous (P), arsenic (As) and boron (B), thereby realizing a low resistance.

Also, a cell region, a NMOS area, and a PMOS area in a CMOS device are all formed with $N^+$ polysilicon gates. In this case, the NMOS device has a surface channel, whereas the PMOS device has a buried channel by a count doping.

Meanwhile, as the integration level of semiconductor devices increases, the width of a gate electrode, e.g. a half-pitch of a gate, has decreased to less than 10 nm. The PMOS device, unlike the NMOS device having a surface channel, is therefore disadvantaged by an increase in a short channel effect due to the buried channel.

Accordingly, a dual gate forming method has been developed in which an $N^+$ poly gate doped with phosphorous (P) is formed in the NMOS forming area and a $P^+$ poly gate doped with boron (B) is formed in the PMOS forming area. In this dual gate forming method, both the NMOS and PMOS channels are surface channels, thereby eliminating the disadvantage created by a buried channel.

Hereafter, a method for forming a dual gate of a semiconductor device in accordance with the prior art will be briefly described.

A cell region of a semiconductor substrate that is divided into the cell region and a peripheral region including PMOS and NMOS forming areas to recess a gate forming area. A gate insulation layer is formed over the entire surface of the semiconductor substrate including the recessed portion. A polysilicon layer is deposited over the gate insulation layer. After P-type impurities are ion implanted into a portion of the polysilicon layer formed in the cell region and the PMOS forming area of the peripheral region to form a $P^+$ polysilicon layer, N-type impurities are ion implanted into the NMOS forming area of the remainder peripheral region to form a $N^+$ polysilicon layer.

After a metallic layer and a hard mask layer are sequentially formed over the $P^+$ polysilicon layer and the $N^+$ polysilicon layer, the hard mask layer, metallic layer, $P^+$ polysilicon layer and the $N^+$ polysilicon layer, and the gate insulation layer are etched to form a gate in each area of each region, thereby forming the dual gate.

However, in the prior art described above, the ion implantation of the P-type impurities is not implanted into the requisite portion of the polysilicon layer formed over the recessed portion of the cell region of the semiconductor substrate in a consistent manner. As a result, the upper end portion of the P+ polysilicon layer formed over the recessed portion of the semiconductor substrate has a high concentration of P-type impurities while the lower end portion of the P+ polysilicon layer has a low concentration of P-type impurities. The threshold voltage (Vt) of the gate formed in the cell region is therefore reduced, thereby compromising device characteristics and lowering reliability.

Meanwhile, in order to form the polysilicon layer doped in a high concentration over the recessed portion of the semiconductor substrate, there has been suggested a method of performing ion implantation of high dose P-type impurities. However, this method causes the refresh characteristic to be lowered because the electric field is increased and thus the leakage current is also increased. Further, using a high dosage when performing ion implantation of the P-type impurities increases the amount of penetrated impurity which subsequently changes the threshold voltage of the transistor, thereby lowering the reliability of the gate insulation layer.

SUMMARY OF THE INVENTION

Embodiments of the present invention are directed to a dual gate of a semiconductor device which is capable of forming a layer doped in a high concentration over a recessed portion of a semiconductor substrate when forming a dual gate having a recess channel structure, and a method for manufacturing the same.

In one embodiment, a dual gate of a semiconductor device comprises a semiconductor substrate divided into a cell region with a recessed gate forming area and a peripheral region with PMOS and NMOS forming areas; first and second conductive type SiGe layers, the first conductive type SiGe layer being formed over the cell region and the PMOS forming area of the peripheral region, and the second conductive type SiGe layer being formed over the NMOS forming area of the peripheral region; first and second conductive type polysilicon layers, the first conductive type polysilicon layer being formed over the first conductive type SiGe layer and the second conductive type polysilicon layer being formed over the second conductive type SiGe layer; and a metallic layer and a hard mask layer stacked over the first and second conductive type polysilicon layers.

The dual gate of a semiconductor device may further comprise a gate insulation layer formed between the first and second conductive type SiGe layers.

The first conductive type is a P-type and the second conductive type is an N-type.

The first and second conductive type SiGe layers have a thickness of 200~400 Å.

The first and second conductive type SiGe layers include a layer having a Ge mole fraction of 10~20% within the SiGe layer.

The first conductive type SiGe layer has a higher doping concentration than the first conductive type polysilicon layer.

The first conductive type SiGe layer has a doping concentration of $4.0 \times 10^{20}$~$6.0 \times 10^{20}$ ions/cm$^3$.

The first conductive type polysilicon layer has a doping concentration of $5.0 \times 10^{19}$~$3.0 \times 10^{20}$ ions/cm$^3$.

The first and second conductive type polysilicon layers have a thickness of 400~1,000 Å.

The second conductive type SiGe layer has a higher doping concentration than the second conductive type polysilicon layer.

The second conductive type SiGe layer has a doping concentration of $4.0\times10^{20}$~$6.0\times10^{20}$ ions/cm$^3$.

The second conductive type polysilicon layer has a doping concentration of $2.0\times10^{20}$~$3.0\times10^{20}$ ions/cm$^3$.

In another embodiment, a method for manufacturing a dual gate of a semiconductor device comprises the steps of forming a SiGe layer over a semiconductor substrate divided into a cell region with a recessed gate forming area and a peripheral region with PMOS and NMOS forming areas; selectively ion implanting a first conductive type impurities into a portion of the SiGe layer formed in the cell region and the PMOS forming area of the peripheral region to convert the portion of the SiGe layer formed in the cell region and the PMOS forming area of the peripheral region into a first conductive type SiGe layer; forming a first polysilicon layer over the first conductive type SiGe layer and the SiGe layer; selectively ion implanting a second conductive type impurities into a portion of the first conductive type polysilicon layer formed in the NMOS forming area of the peripheral region and a portion of the SiGe layer below the portion of the first conductive type polysilicon layer to convert the portion of the first conductive type polysilicon layer formed in the NMOS forming area of the peripheral region into a second conductive type polysilicon layer and to convert the portion of the SiGe layer into a second conductive type SiGe layer; and forming a metallic layer and a hard mask layer over the first and the second conductive type layers.

The method may further comprise, prior to the step of forming the SiGe layer, the step of forming a gate insulation layer over the semiconductor substrate.

The method may further comprise, after the step of forming the gate insulation layer and before the step of forming the SiGe layer, the step of nitriding the surface of the gate insulation layer.

The first conductive type is a P-type and the second conductive type is an N-type.

The SiGe layer is formed with a thickness of 200~400 Å.

The SiGe layer includes a layer having a Ge mole fraction of 10~20% within the SiGe layer.

The step of ion implanting the first conductive type impurities is performed using B or BF$_2$ in a dose of $2.0\times10^{15}$~$6.0\times10^{15}$ ions/cm$^2$.

The first conductive SiGe layer is converted so as to have a higher doping concentration than the first conductive type polysilicon layer.

The first conductive type SiGe layer is converted so as to have a concentration of $4.0\times10^{20}$~$6.0\times10^{20}$ ions/cm$^3$.

The first conductive type polysilicon layer is formed so as to have a concentration of $5.0\times10^{19}$~$3.0\times10^{20}$ ions/cm$^3$.

The first conductive type polysilicon layer is formed with a thickness of 400~1,000 Å.

The step of converting the first conductive type polysilicon layer into the second conductive type polysilicon layer and converting the SiGe layer into the second conductive type SiGe layer is performed by ion implanting As or P in a dose of $3.0\times10^{15}$~$7.0\times10^{15}$ ions/cm$^2$.

The second conductive type SiGe layer is converted so as to have a higher doping concentration than the second conductive type polysilicon layer.

The second conductive type SiGe layer is converted so as to have a doping concentration of $4.0\times10^{20}$~$6.0\times10^{20}$ ions/cm$^3$.

The second conductive type polysilicon layer is converted so as to have a doping concentration of $2.0\times10^{20}$~$3.0\times10^{20}$ ions/cm$^3$.

The method may further comprise, after the step of converting the first conductive type polysilicon layer into the second conductive type polysilicon layer and converting the SiGe layer into the second conductive type SiGe layer and before the step of sequentially forming the metallic layer and the hard mask layer, the step of heat treating the semiconductor substrate in a state of converted into the second conductive type polysilicon layer and the second conductive type SiGe layer.

DESCRIPTION OF SPECIFIC EMBODIMENTS

In the present invention, since a SiGe layer is formed over the cell region with a recessed gate forming area and a peripheral region with PMOS and NMOS forming areas of a semiconductor substrate, it is possible to dope P-type and N-type impurities into the SiGe layer in a high concentration. Therefore, in the present invention, since it is possible to form a layer doped with P-type and N-type impurities in a high concentration over the semiconductor substrate including the recessed portion, it is possible to improve the threshold voltage of the PMOS and NMOS and thus enhance the device characteristic and reliability.

Hereafter, a preferred embodiment of the present invention will be described in detail with reference to the accompanying drawings.

Figure 1:
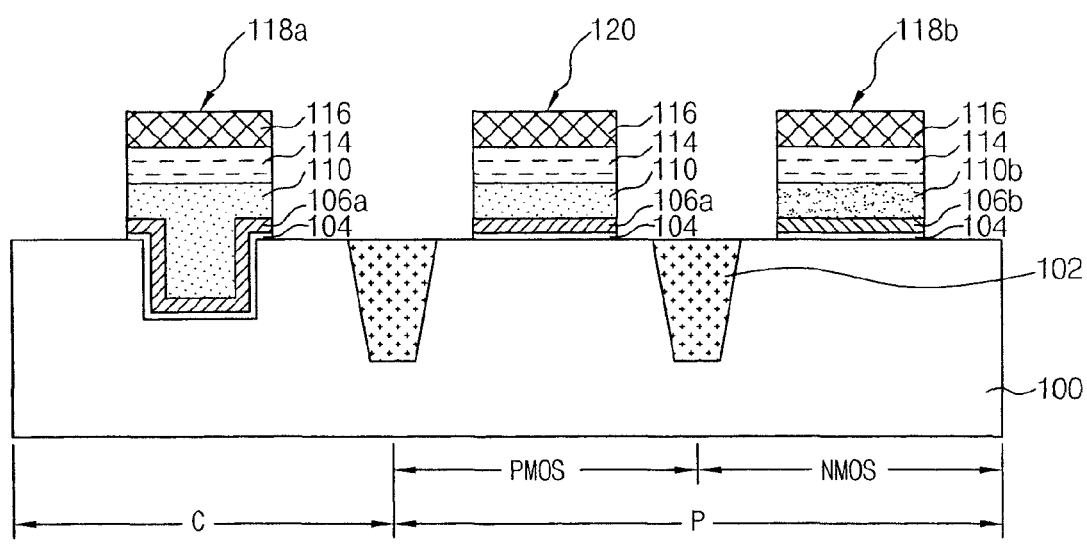
FIG. 1 is a cross-sectional view showing a dual gate of a semiconductor device in accordance with an embodiment of the present invention.

FIG. 1 is a cross-sectional view illustrating a dual gate of a semiconductor device in accordance with an embodiment of the present invention.

As shown, in a semiconductor substrate 100 divided into a cell region C and a peripheral region P including a PMOS forming area and a NMOS forming area, an isolation layer 102 is formed so as to isolate the areas. A gate forming area of the cell region C is recessed and the recessed gate forming area of the cell region C is formed with a first gate 118a. The PMOS forming area of the peripheral region P is formed with a second gate 120 and the NMOS forming area of the peripheral region P is formed with a third gate 118b.

The first gate 118a formed in the recessed gate forming area of the cell region C and the second gate 120 formed in the PMOS forming area of the peripheral region P include a stacked structure of a gate insulation layer 104, a P-type SiGe layer 106a, a P-type polysilicon layer 110, a metallic layer 114 and a hard mask layer 116. The P-type SiGe layer 106a has a Ge mole fraction of 10~20% and a thickness of 200~400 Å. The P-type polysilicon layer 110 has a thickness of 400~1,000 Å.

The P-type SiGe layer 106a has a higher doping concentration than that of the P-type polysilicon layer 110. For example, the P-type SiGe layer 106a has a doping concentration of $4.0\times10^{20}$~$6.0\times10^{20}$ ions/cm$^3$ and the P-type polysilicon layer 110 has a doping concentration of $5.0\times10^{19}$~$3.0\times10^{20}$ ions/cm$^3$.

The third gate 118b formed in the NMOS forming area of the peripheral region P includes a stacked structure of a gate insulation layer 104, an N-type SiGe layer 106b, an N-type polysilicon layer 110b, a metallic layer 114 and a hard mask layer 116. The N-type SiGe layer 106b has a Ge mole fraction of 10~20% and a thickness of 200~400 Å. The N-type polysilicon layer 110b has a thickness of 400~1,000 Å.

The N-type SiGe layer 106b has a higher doping concentration than that of the N-type polysilicon layer 110b. For example, the P-type SiGe layer 106a has a doping concentration of $4.0\times10^{20}$~$6.0\times10^{20}$ ions/cm$^3$ and the N-type polysilicon layer 110b has a doping concentration of $2.0\times10^{20}$~$3.0\times10^{20}$ ions/cm$^3$.

As such, in the present invention, since the P-type and the N-type SiGe layers 106a and 106b doped with P-type and N-type impurities in a high concentration are formed over the semiconductor substrate 100 including the recessed portion in the cell region C, threshold voltages of the first gate 118a in the cell region C and the second gate 120 and the third gate 118b in the peripheral region P are improved, thereby enhancing the characteristics and reliability of the device.

FIGS. 2A through 2G are cross-sectional views illustrating the process steps of a method for manufacturing a dual gate of a semiconductor device in accordance with another embodiment of the present invention.

Figure 2A:
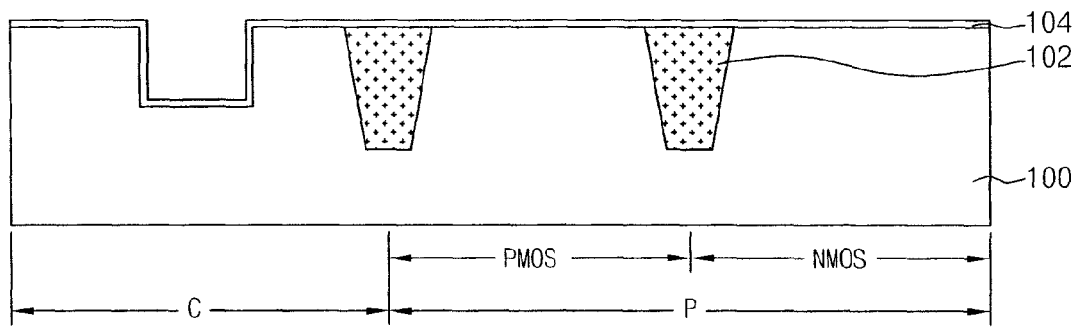
FIGS. 2A through 2G are cross-sectional views for illustrating the process steps of a method for manufacturing a dual gate of a semiconductor device in accordance with another embodiment of the present invention.

Referring to FIG. 2A, in the semiconductor substrate 100 divided into the cell region C and the peripheral region P including the PMOS forming area and the NMOS forming area, the isolation layer 102 is formed so as to isolate the areas. An ion implantation process is performed on the substrate 100 formed with the isolation layer 102 to form a P-well (not shown) in the cell region C and the NMOS forming area of the peripheral region P, and an N-well (not shown) in the PMOS forming area of the peripheral region P.

The gate forming area of the cell region C is recessed. The gate insulation layer 104, made of an oxide layer, for example, is formed over the entire surface of the semiconductor substrate 100 including the recessed portion. The surface of the oxide gate insulation layer 104 may be nitrided.

Figure 2B:
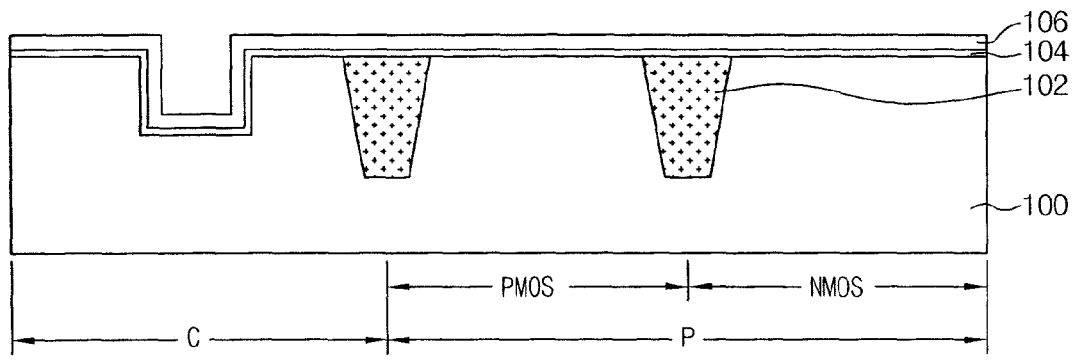

Referring to FIG. 2B, the SiGe layer 106 is formed with a thickness of 200~400 Å over the gate insulation layer 104. The SiGe layer 106 is formed without doping and is formed such that the Ge mole fraction in the SiGe layer 106 is 10~20%.

Figure 2C:
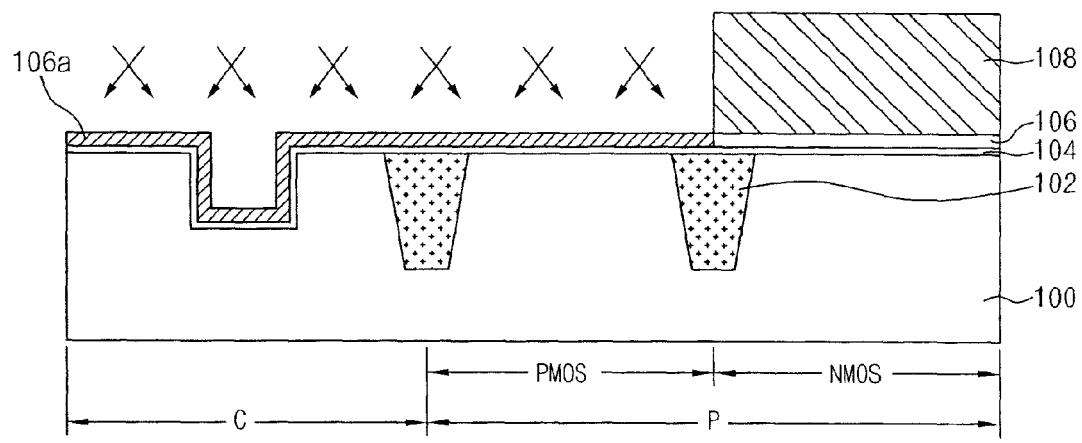

Referring to FIG. 2C, a first mask pattern 108, which covers the NMOS forming area of the peripheral region P but exposes the cell region C and the PMOS forming area of the peripheral region P, is formed over the SiGe layer 106. P-type impurities e.g. B or BF2 are selectively ion implanted into the exposed portion of the SiGe layer 106 in the cell region C and the PMOS forming area of the peripheral region P to convert the portion of the SiGe layer 106 in the cell region C and the PMOS forming area of the peripheral region P to the P-type SiGe layer 106a. The ion implantation of the P-type impurities may be performed in a vertical ion implantation method or a tilt ion implantation method so long as the ion implantation is evenly performed, including along the portion of the SiGe layer formed over the recessed portion of the semiconductor substrate 100 in the cell region C. The ion implantation of the P-type impurities is performed with a dose of $2.0\times10^{15}$~$6.0\times10^{15}$ ions/cm$^2$.

Since the present invention uses a SiGe layer 106 having the Ge mole fraction of approximately 10~20% and superior solubility of the P-type and N-type impurities, it is possible to dope the P-type impurities in a high concentration into the portion of the SiGe layer formed in the PMOS forming area in the peripheral region P including the recessed gate forming area in the cell region C through ion implantation of the P-type impurities. For example, in the present invention, it is possible to form the P-type SiGe layer 106a having a doping concentration of $4.0\times10^{20}$~$6.0\times10^{20}$ ions/cm$^3$.

Figure 2D:
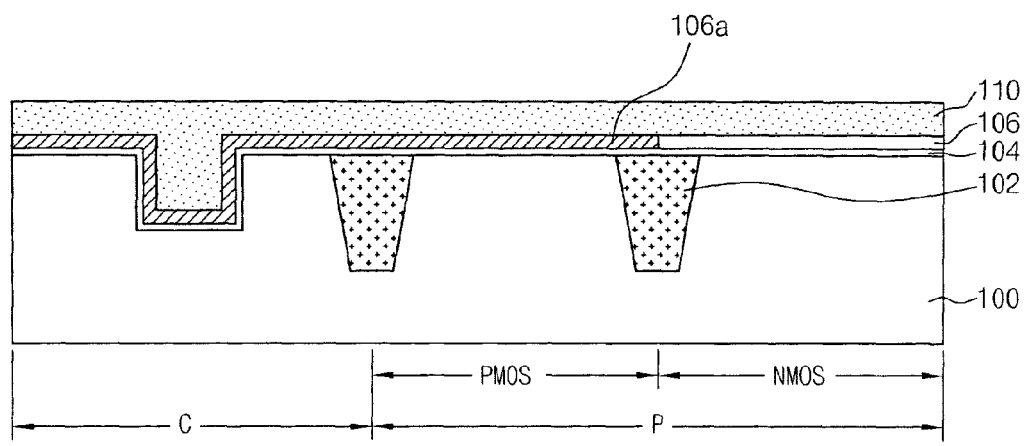

Referring to FIG. 2D, the first mask pattern 108 is removed. Then, the P-type polysilicon layer 110 is formed with a thickness of 400~1,000 Å over the P-type SiGe layer 106a and the SiGe layer 106 in the NMOS forming area of the peripheral region P without being doped with P-type impurities. The P-type polysilicon layer 110 is preferably formed in a doping concentration of $5.0\times10^{19}$~$3.0\times10^{20}$ ions/cm$^3$ so that the P-type impurities are doped at a lower concentration than the P-type SiGe layer 106a.

Figure 2E:
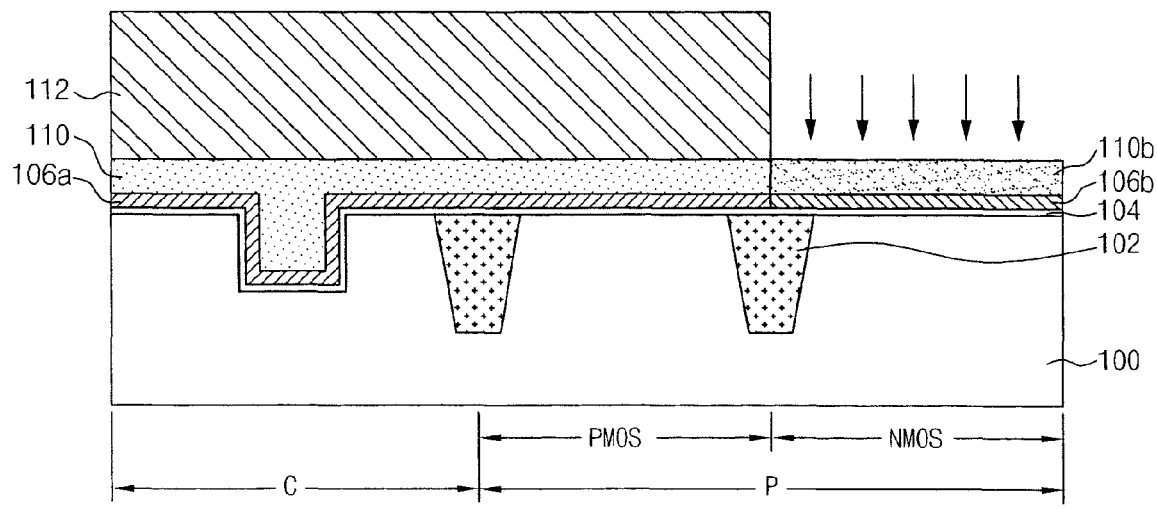

Referring to FIG. 2E, a second mask pattern 112, which covers the cell region C and the PMOS forming area of the peripheral region P but exposes the NMOS forming area of the peripheral region P, is formed over the P-type polysilicon layer 110. N-type impurities, e.g. As or P, are selectively ion implanted into the exposed portion of the P-type polysilicon layer 110 in the NMOS forming area of the peripheral region P and the portion of the SiGe layer therebelow to convert the exposed portion of the P-type polysilicon layer 110 in the NMOS forming area of the peripheral region P into the N-type polysilicon layer 110b and convert the portion of the SiGe layer therebelow into the N-type SiGe layer 106b. The ion implantation of the N-type impurities is performed with a dose of $3.0\times10^{15}$~$7.0\times10^{15}$ ions/cm$^2$ so that the portion of the P-type polysilicon layer formed in the NMOS forming area of the peripheral region P can be converted into the N-type polysilicon layer 110b.

Since the SiGe layer having the Ge mole fraction of approximately 10~20% in the present invention has superior solubility of the P-type and N-type impurities, it is possible to dope the N-type impurities in a high concentration into the SiGe layer formed in the NMOS forming area of the peripheral region P through ion implantation of the N-type impurities. For example, in the present invention, it is possible to form the N-type SiGe layer 106b such that is has a doping concentration of $4.0\times10^{20}$~$6.0\times10^{20}$ ions/cm$^3$. Also, the N-type polysilicon layer 110b over the N-type SiGe layer 106b is preferably formed with a doping concentration of $2.0\times10^{20}$~$3.0\times10^{20}$ ions/cm$^3$ so as to be doped at the lower concentration than the N-type SiGe layer 106b.

Figure 2F:
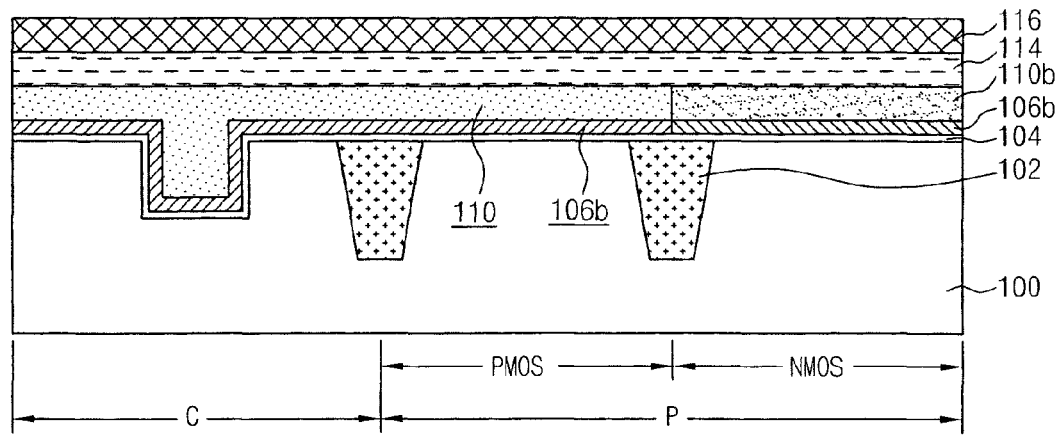

Referring to FIG. 2F, the second mask pattern is removed. The resultant semiconductor substrate is heat treated such that the P-type and N-type impurities doped into the P-type and N-type SiGe layers 106a and 106b and the P-type and N-type polysilicon layers 110 and 110b are activated. The metallic layer 114 and the hard mask layer 116 are sequentially formed over the heat treated P-type and N-type polysilicon layers 110 and 110b. The metallic layer 114 is preferably formed of a W layer or a WSi$_x$ layer and the hard mask layer 116 is formed, for example, of a nitride layer.

Figure 2G:
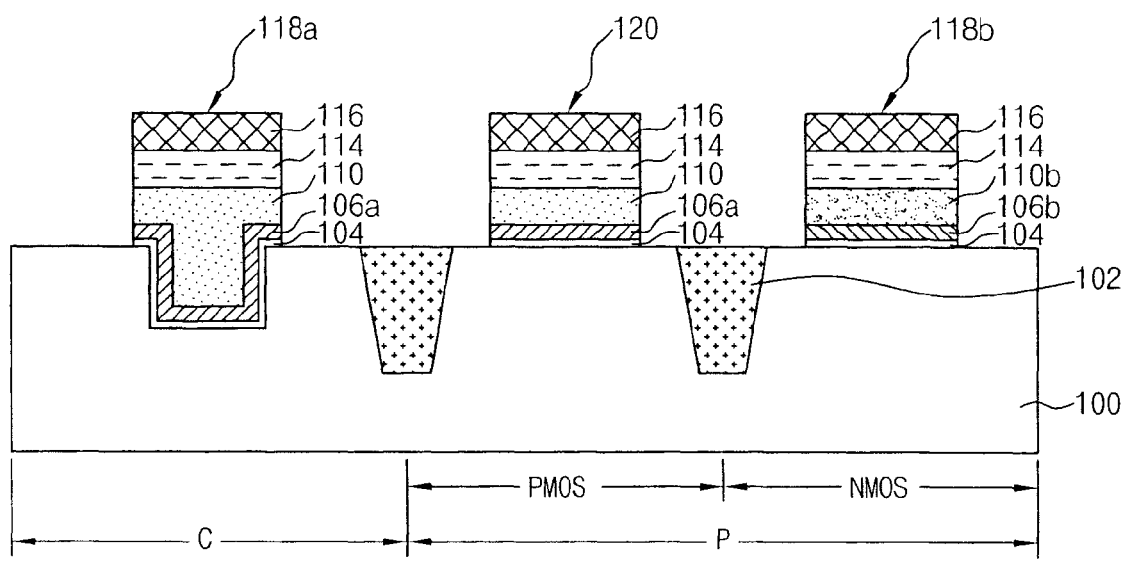

Referring to FIG. 2G, the hard mask layer 116, the metallic layer 114, the P-type and N-type polysilicon layers 110 and 110b, the P-type and N-type SiGe layers 106a and 106b, and the gate insulation layer 104 are etched to form the gates 118a, 120 and 118b in each area in each region, thereby forming the dual gate.

In other words, the cell region C is formed with a first gate 118a including the P-type SiGe layer 106a and the P-type polysilicon layer 110, the PMOS forming area of the peripheral region P is formed with a second gate 120 including the P-type SiGe layer 106a and the P-type polysilicon layer 110 and the NMOS forming area of the peripheral region P is formed with a third gate 118b including the N-type SiGe layer 106b and the N-type polysilicon layer 110b.

Figure 3A:
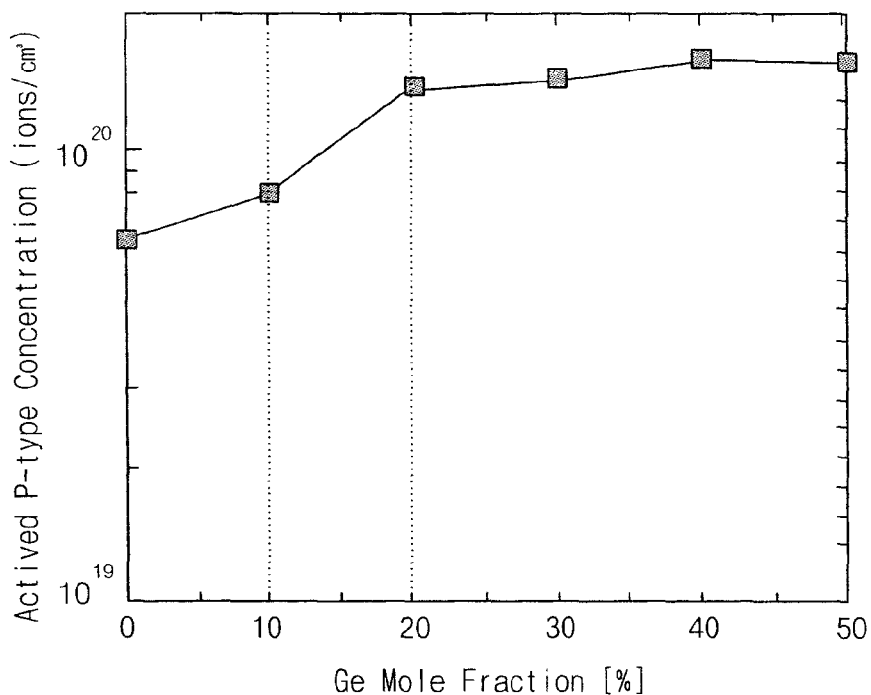
FIGS. 3A and 3B are graphs showing the concentration of activated P-type and N-type impurities in accordance with a Ge mole fraction respectively.
Figure 3B:
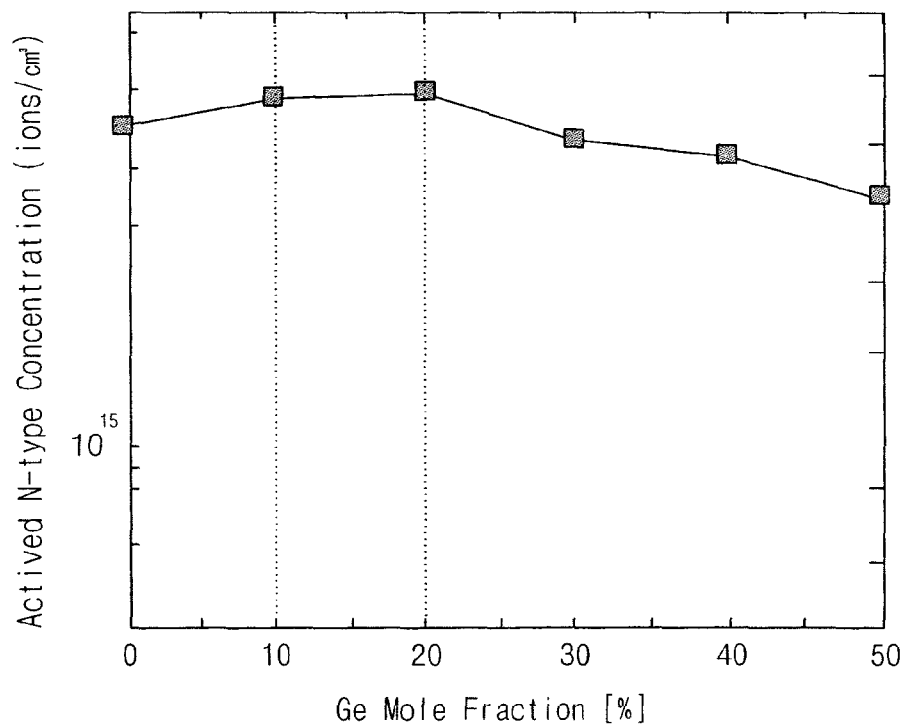

FIGS. 3A and 3B are graphs showing the variation in the concentration of activated P-type and N-type impurities in is accordance with the Ge mole fraction respectively when P-type and N-type impurities are ion implanted into a SiGe layer with a thickness of 47 Å in a dose of $5.0 \times 10^{15}$ ions/cm² respectively.

As shown, it is possible to dope the P-type and N-type impurities in the maximum concentration when the Ge mole fraction in the SiGe layer is 10~20%.

Accordingly, in the present invention, by forming the SiGe layer having the Ge mole fraction of 10~20% over the semiconductor substrate including the recessed portion in the cell region and performing the ion implantation process of the P-type and N-type impurities, it is possible to form a layer doped with P-type impurities in a high concentration over the recessed portion of the semiconductor substrate in the cell region.

Therefore, in the present invention, by forming the layer doped with the P-type impurities in a high concentration over the recessed portion of the semiconductor substrate in the cell region, it is possible to increase the threshold voltage of a transistor and thus improve the characteristics and reliability of the device. Also, it is possible to reduce the electric field and leakage current thereby enhancing the cell refresh time and thus improving the refresh characteristic.

Further, in the present invention, since the SiGe layer is also formed over the surface of the semiconductor substrate in the peripheral region, it is possible to form the layer doped with the N-type impurities in a high concentration over the semiconductor substrate in the NMOS forming area in the peripheral region without performing the process of the ion implantation of N-type impurities for converting the P-type polysilicon layer formed in the NMOS forming area into the N-type polysilicon layer in a high dose.

Furthermore, in the present invention, since the process of the ion implantation of N-type impurities may be performed at a lower dose than the prior art, it is possible to relieve the curing phenomenon of a mask pattern made of a photosensitive film and thereby prevent the mask pattern from remaining after the ion implantation process.

Additionally, in the present invention, since the layer doped with the P-type and N-type impurities in a high concentration is formed over the semiconductor substrate in the cell region and the PMOS and NMOS forming areas of the peripheral region, it is possible to improve the depletion phenomenon of the polysilicon layer and thus improve the operation current of the transistor, thereby enhancing the operation characteristics of the device.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A dual gate of a semiconductor device, comprising:
a semiconductor substrate comprising a cell region and a peripheral region, the cell region having a recessed gate forming area and the peripheral region having PMOS and NMOS forming areas;
a first conductive type SiGe layer formed over the cell region and the PMOS forming area of the peripheral region;
a second conductive type SiGe layer formed over the NMOS forming area of the peripheral region;
a first conductive type polysilicon layer formed over the first conductive type SiGe layer;
a second conductive type polysilicon layer formed over the second conductive type SiGe layer; and
a metallic layer and a hard mask layer stacked over the first and second conductive type polysilicon layers,
wherein each of the first and second conductive type SiGe layers includes a layer having a Ge mole fraction of 10~20% within the SiGe layer.

2. The dual gate of a semiconductor device according to claim 1, wherein the first conductive type is a P-type, and the second conductive type is an N-type.

3. The dual gate of a semiconductor device according to claim 1, wherein each of the first and second conductive type SiGe layers has a thickness of 200~400 Å.

4. The dual gate of a semiconductor device according to claim 1, wherein the first conductive type SiGe layer has a higher doping concentration than the first conductive type polysilicon layer.

5. The dual gate of a semiconductor device according to claim 4, wherein the first conductive type SiGe layer has a doping concentration of $4.0 \times 10^{20} \sim 6.0 \times 10^{20}$ ions/cm³.

6. The dual gate of a semiconductor device according to claim 4, wherein the first conductive type polysilicon layer has a doping concentration of $5.0 \times 10^{19} \sim 3.0 \times 10^{20}$ ions/cm³.

7. The dual gate of a semiconductor device according to claim 1, wherein each of the first and second conductive type polysilicon layers has a thickness of 400~1,000 Å.

8. The dual gate of a semiconductor device according to claim 1, wherein the second conductive type SiGe layer has a higher doping concentration than the second conductive type polysilicon layer.

9. The dual gate of a semiconductor device according to claim 8, wherein the second conductive type SiGe layer has a doping concentration of $4.0 \times 10^{20} \sim 6.0 \times 10^{20}$ ions/cm³.

10. The dual gate of a semiconductor device according to claim 8, wherein the second conductive type polysilicon layer has a doping concentration of $2.0 \times 10^{20} \sim 3.0 \times 10^{20}$ ions/cm³.

* * * * *